United States Patent [19]
Beyer

[11] Patent Number: 6,003,676
[45] Date of Patent: Dec. 21, 1999

[54] PRODUCT CARRIER AND METHOD OF MAKING SAME

[75] Inventor: Anthony W. Beyer, Elburn, Ill.

[73] Assignee: Tek Pak, Inc., Batavia, Ill.

[21] Appl. No.: 08/985,505

[22] Filed: Dec. 5, 1997

[51] Int. Cl.$^6$ ................................................ B65D 85/00
[52] U.S. Cl. ........................................ 206/714; 206/725
[58] Field of Search .................................. 206/713, 714, 206/716, 717, 725

[56] References Cited

U.S. PATENT DOCUMENTS

| | | |
|---|---|---|
| 3,199,419 | 8/1965 | Lang, Jr. . |
| 3,311,229 | 3/1967 | Troll et al. . |
| 3,465,874 | 9/1969 | Hugle et al. . |
| 3,858,721 | 1/1975 | Boyer et al. . |
| 3,946,864 | 3/1976 | Hutson . |
| 4,272,473 | 6/1981 | Riemersma et al. . |
| 4,411,362 | 10/1983 | Itemadani et al. . |
| 4,562,924 | 1/1986 | Okamoto . |
| 4,564,880 | 1/1986 | Christ et al. . |
| 4,633,370 | 12/1986 | Hamuro et al. ................ 206/714 |

(List continued on next page.)

FOREIGN PATENT DOCUMENTS

| | | |
|---|---|---|
| 0045368 | 2/1990 | Japan . |
| 0127256 | 5/1990 | Japan . |
| 404201872 | 7/1992 | Japan . |
| 405170275 | 7/1993 | Japan . |

OTHER PUBLICATIONS

EIA Standard; EIA–481–2; Mar. 1991; Entitled: 16 mm and 24 mm Embossed Carrier Taping of Surface Mount Components for Automatic Handling.

EIA Standard; EIA–481–3; Nov. 1991; Entitled: 32 mm, 44 mm and 56 mm Embossed Carrier Taping Surface Mount Components for Automatic Handling.

EIA Standard; EIA–481–1A; Aug. 1994; Entitled: 8 mm & 12 mm Punched & Embossed Carrier Taping of Surface Mount Components for Automatic Handling.

*Primary Examiner*—David T. Fidei
*Attorney, Agent, or Firm*—Rockey, Milnamow & Katz, Ltd.

[57] ABSTRACT

A carrier tape formed with a plurality of product receiving pockets molded therein. Pocket detail is formed by moving a male mold element and the carrier tape relatively toward one another thereby causing a respective region of the tape to conform to the shape of the mold element. Fluid pressure can be used to drive the carrier tape further into conformity with the shape of the respective mold element. A vacuum channel can be provided in the mold element to reduce the pressure on the side of the tape adjacent to the mold thereby increasing the pressure differential across the tape. Both multi-station linear and rotary molds carrying male molding surfaces can be used to increase throughput. Product positioning surfaces, formed on the male mold elements can be imparted to the interior of the formed pockets along with light diffusing patterns to provide improved performance by scanning or optical monitoring systems.

28 Claims, 6 Drawing Sheets

U.S. PATENT DOCUMENTS

| | | |
|---|---|---|
| 4,702,370 | 10/1987 | Honda . |
| 4,712,675 | 12/1987 | Scholten et al. . |
| 4,736,841 | 4/1988 | Kaneko et al. . |
| 4,819,801 | 4/1989 | Howard . |
| 4,898,275 | 2/1990 | Skrtic et al. . |
| 4,963,405 | 10/1990 | Yamashita et al. . |
| 4,966,281 | 10/1990 | Kawanishi et al. . |
| 4,966,282 | 10/1990 | Kawanishi et al. . |
| 5,026,303 | 6/1991 | Matsuoka et al. . |
| 5,066,245 | 11/1991 | Walker . |
| 5,076,427 | 12/1991 | Thomson et al. . |
| 5,101,975 | 4/1992 | Runyon et al. . |
| 5,115,911 | 5/1992 | Schulte et al. . |
| 5,132,160 | 7/1992 | Bird . |
| 5,136,827 | 8/1992 | Sawaya . |
| 5,152,393 | 10/1992 | Chenoweth . |
| 5,199,564 | 4/1993 | Skrtic . |
| 5,226,226 | 7/1993 | Fierkens . |
| 5,234,104 | 8/1993 | Schulte et al. . |
| 5,259,500 | 11/1993 | Alvite et al. . |
| 5,265,723 | 11/1993 | Chenweth et al. . |
| 5,333,733 | 8/1994 | Murata . |
| 5,351,821 | 10/1994 | Skrtic . |
| 5,361,901 | 11/1994 | Schenz et al. . |
| 5,390,472 | 2/1995 | Weller et al. . |
| 5,396,988 | 3/1995 | Skrtic ....................................... 206/716 |
| 5,447,784 | 9/1995 | Williams et al. ....................... 206/713 |
| 5,499,717 | 3/1996 | Hayashi . |
| 5,524,765 | 6/1996 | Gutentag . |
| 5,664,680 | 9/1997 | Hamlin . |
| 5,810,170 | 9/1998 | Alvite ...................................... 206/717 |

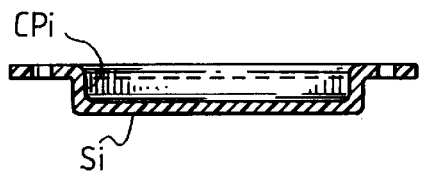
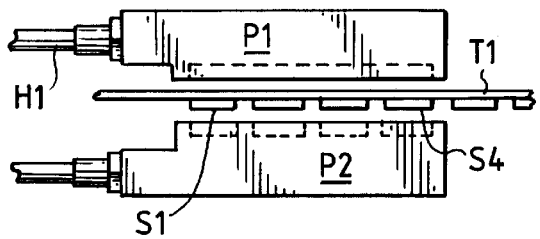
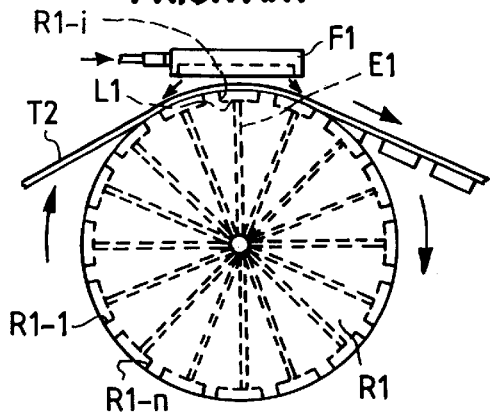
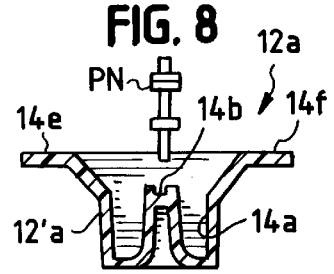
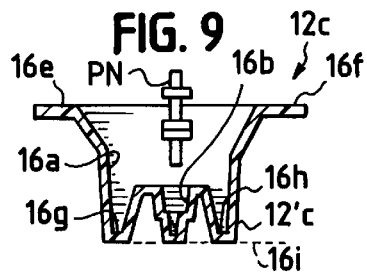
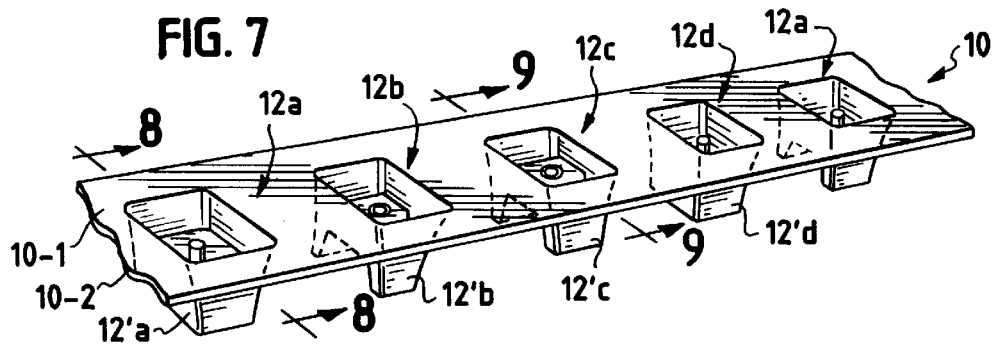
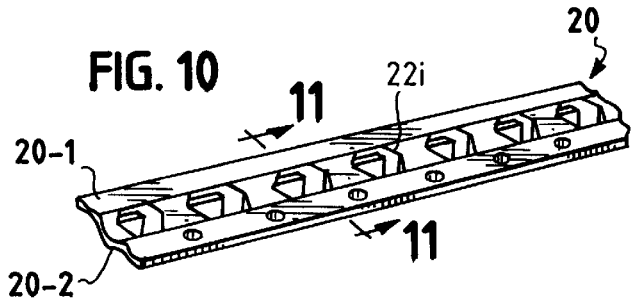
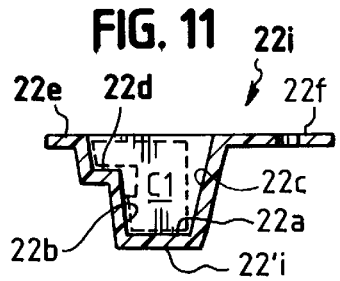

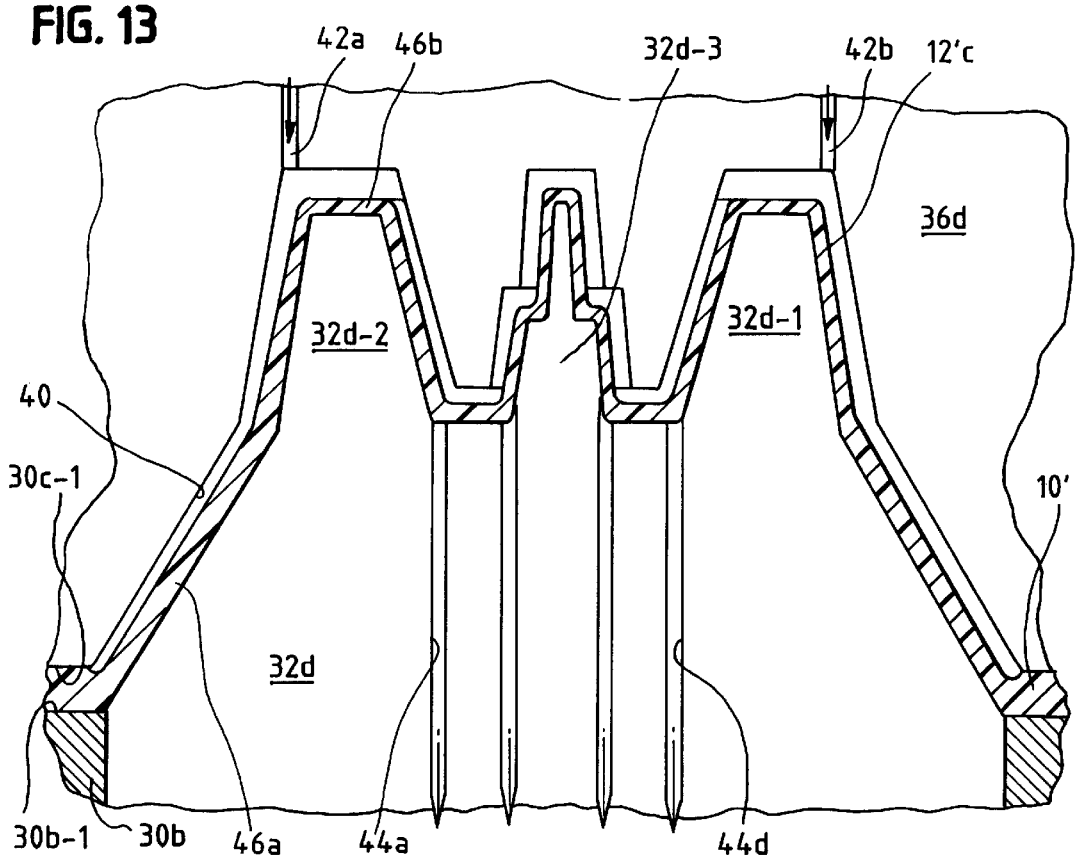
FIG. 13
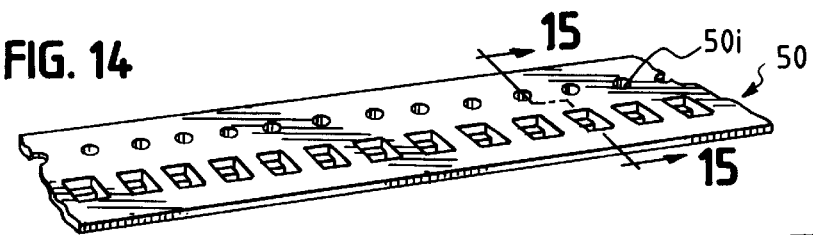
FIG. 14
FIG. 15
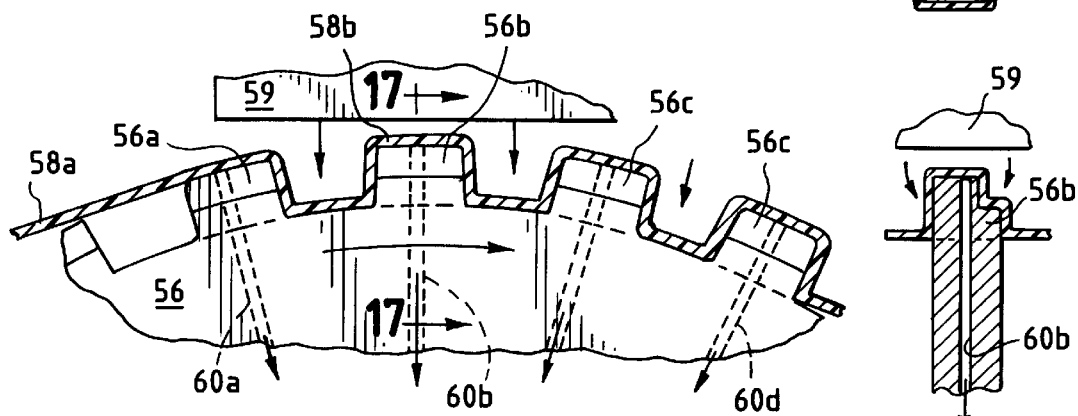
FIG. 16
FIG. 17

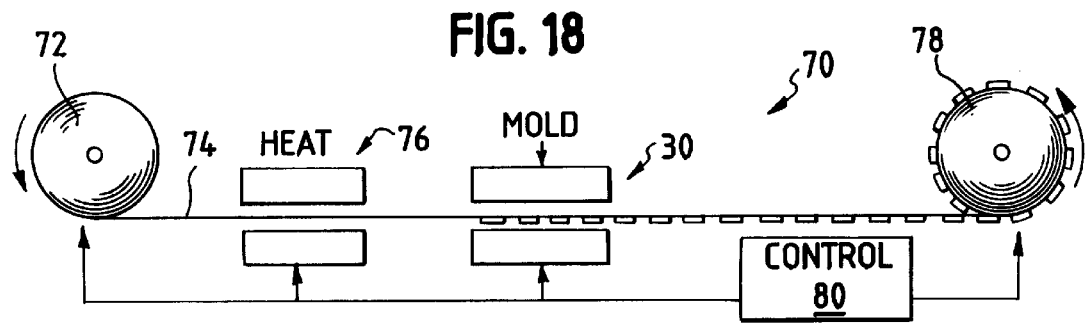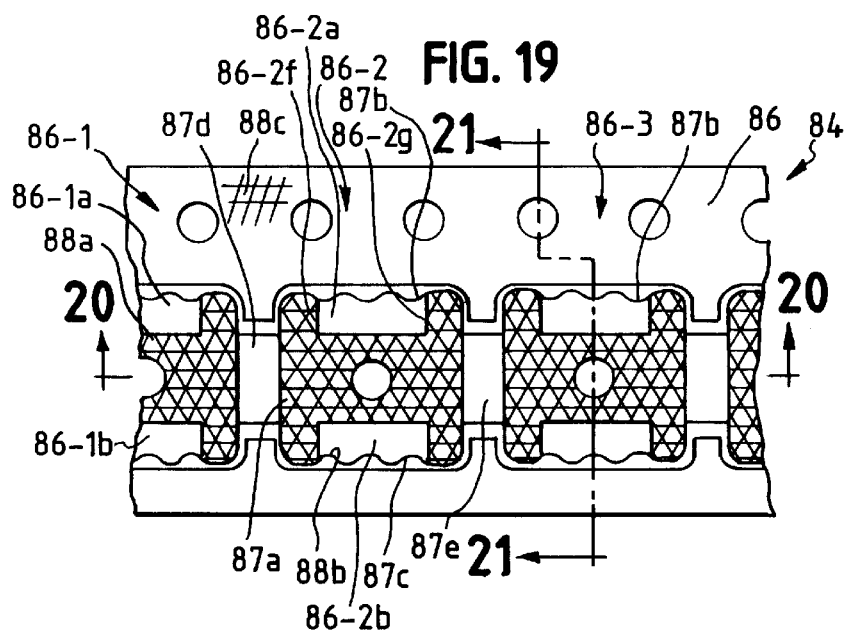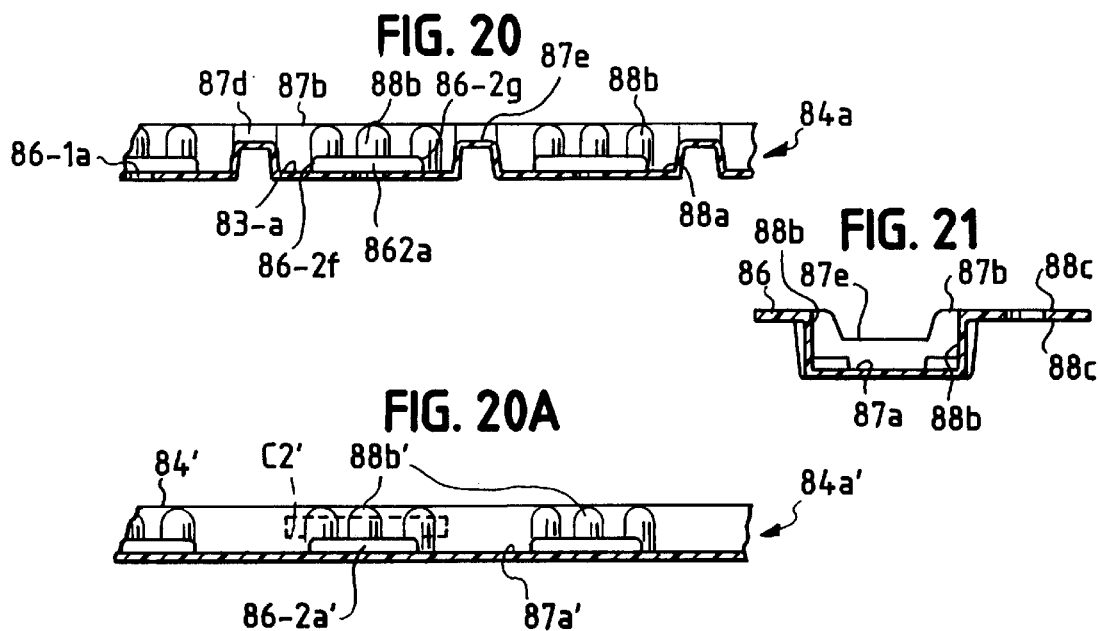

PRODUCT CARRIER AND METHOD OF MAKING SAME

FIELD OF THE INVENTION

The invention pertains to product or component carriers. More particularly, the invention pertains to product or component carriers wherein product positioning details are formed on surfaces some of which are directly in contact with the respective product or component.

BACKGROUND OF THE INVENTION

The use of embossed plastic carrier tapes for use with surface mount components such as semiconductors including integrated circuits, contact elements or discrete electrical elements such as capacitors and resistors to facilitate automatic handling, insertion and connection to printed circuit boards or other types of substrates is well-recognized. Embossed carrier tapes are fabricated to meet standardized requirements with respect, for example, to leader characteristics, pitch, trailer characteristics and cover tape.

Embossed carrier tapes are specified, for example, in 16 mm and 24 mm sizes in the March, 1991, Standard, EIA-481-2 entitled "16 mm and 24 mm Embossed Carrier Taping of Surface Mount Components for Automatic Handling". Other tapes are specified in EIA-481-3 November of 1991, entitled "32 mm, 44 mm and 56 mm Embossed Carrier Taping of Surface Mount Components for Automatic Handling". EIA-481-1-A, August, 1994, entitled "8 mm and & 12 mm Punched & Embossed Carrier Taping of Surface Mount Components for Automatic Handling" specifies yet other tape sizes.

Notwithstanding the availability of the above noted standards, there is an ongoing need to be able to more precisely position and carry smaller and smaller components. This requires heretofore unavailable carrier tapes which can be manufactured at high speed to tighter tolerances than have been available using prior art approaches.

FIGS. 1 through 6 illustrate various deficiencies of known prior art approaches. FIGS. 1, 2 and 4 illustrate two different prior art carrier tapes. FIGS. 3 and 5 illustrate molds used to form the types of carrier tapes illustrated in FIGS. 1, 2 and 4 and in particular that of FIG. 4. FIG. 6 illustrates another form of a prior art mold usable to form tapes of a type illustrated in FIG. 4.

In FIG. 3, a prior art two-part molding system includes an upper or cover portion P1 and a lower or detail portion P2. The cover portion P1 is shown in FIG. 3 at a slight angle only for purposes of discussing the operation and characteristics thereof. In normal operation, the elements P1, P2 would exhibit relative linear motion toward and away form one another during the manufacturing process. The elements P1 and P2 cooperate to mold or emboss carrier tape T1, using a known prior art approach.

Carrier tape T1 is initially a planar flexible thermal plastic tape of a predetermined width and thickness which is positioned between elements P1 and P2 after having been heated to an appropriate temperature. Once the mold elements P1 and P2 are brought together with a section of the carrier tape T1 therebetween, air pressure can be injected via hose H1 into the cavity C1. The air pressure in the cavity C1 forces the portion of the carrier tape T1 between elements P1 and P2 into the pocket defining female molds M1, M2, M3 and M4. This, in turn, forms a plurality of carrier pockets CP1, . . . CP4 in the respective region of the tape T1.

As is clear from FIGS. 3, 4 and 5 in the prior art approach, since the carrier tape T1 is forced into the female mold elements M1 . . . M4, all of the detail present in those mold elements will be transferred to an outer surface S1 . . . S4 associated with the respective pocket CP1 . . . CP4. As clearly illustrated in FIG. 4, the respective outer surface Si is displaced away from and is not present in the component carrying pocket CPi. Similar comments apply to the carrier tapes of FIGS. 1, 2.

Because of the structure of mold elements P1, P2 the exact detail of the mold cavities M1 . . . M4, is embossed on the respective outer surfaces S1 . . . S4. Conversely, the component carrying pocket, for example CPi of FIG. 4, is formed with much less detail or definition due to not having direct contact with the mold cavities M1 . . . M4. The lack of direct contact by the mold element with the component positioning surfaces being formed limits the tolerances and precision to which those surfaces can be formed. The fact that the tolerances can not be reduced as needed for smaller parts limits the prior art technology.

In addition, as the respective regions of the carrier tape T1 are driven into the mold cavities M1 . . . M4, the thermal plastic material which makes up the tape T1 stretches. This, in turn, thins the walls of the cavity CPi and introduces wall thickness variations, which are not always of a predictable nature, into the respective cavity.

Using the prior art approach, each of the pockets formed in the carrier tape suffers from a loss of definition due to an absence of direct contact with the respective mold cavity in the block P2. Those pockets also suffer from variable wall thicknesses brought about by the molding process which may be of an unpredictable and random nature. Further, these variations are on the side of the component pocket where it is most desirable to hold the closest tolerances since it is that side of the pocket which ultimately determines the location of the product or component being carried on the tape.

Rotary molds, illustrated in FIG. 6, are also known in the prior art. In such molds, female cavities R1-1, R1-2 . . . R1-n, corresponding to the cavities M1 . . . M4 of element P2 were formed in a rotary mold element such as element R1. Carrier tape T2 would be fed across the mold element R1 at a predetermined rate, consistent with the speed of rotation of the element R1.

At the appropriate location, L1 either compressed air can be driven against the adjacent region of the tape T2 using fixture F1 and/or the respective cavity R1-i currently at the location L1 can be evacuated using evacuation conduit E1 to thereupon force-draw the relevant region of the tape T2 into the respective cavity. The rotary mold R1, as was the case with the linear mold combination P1, P2 imparts all of the detail of the respective cavity to the outside surfaces of the component carrying pocket being formed, comparable to that pocket illustrated in FIG. 4.

Using the known approaches, carrier tape on the order of 0.016 inches thick can be embossed using air pressure in a range of 30 to 100 psi and molds of the general type illustrated in FIGS. 3 and 6. This process results in compo- nent carrier pockets wherein positioning tolerances can only be held to within ±0.005 inches.

There continues to be a need for molds and methods which can be used to produce molded carrier tape to smaller tolerances than has heretofore been possible using the prior art approaches. Preferably such molds and methods can be configured so as to minimize in-pocket variations due to variable wall thicknesses.

It would also be preferably if such carrier tapes could be manufactured in a way that light incident thereon will be dispersed instead of reflected. Suppression of such reflections is desirable in scanning or optical monitoring systems which can used to check product or component location and contact arrangement in the carrier pocket.

SUMMARY OF THE INVENTION

A product carrier can be formed in a flexible planar plastic member by molding or embossing a product receiving pocket into the member. The pocket includes at least one product positioning surface formed in the pocket. The pocket and the surface are formed in response to corresponding surfaces of a male mold element engaging and deflecting a respective portion of the planar member.

The male mold element carries product positioning detail which is imparted to the shape of the pocket being formed by bringing the male mold element into contact with one side of the respective region of the tape. In this fashion, all of the component or product positioning detail is imparted directly into surfaces formed within the pocket.

In one aspect, fluid pressure can be applied against the other side of the carrier tape forcing it against the male mold element to more accurately and more faithfully conform the interior surface of the pocket to the exterior surface of the male mold. In yet another embodiment, one or more channels can be formed in the male mold. As the carrier tape is being forced around and formed to the male mold, a vacuum can be drawn via the conduit. The low pressure produced by the vacuum creates a greater pressure differential relative to air pressure on the other side of the carrier tape thereby further improving the conformity between the interior of the pocket and the adjacent male mold.

In yet another aspect, surfaces on or adjacent to the male mold element can be interrupted by a predetermined pattern, such as cross hatching or corrugations or undulations. These patterns can in turn be transferred to the adjacent regions of the carrier tape and the respective pocket during the molding process. Hence, the finished carrier tape exits the mold not only with detailed product positioning surfaces formed therein but also carrying light dispersing patterns which can be expected to improve the performance of scanning or optical monitoring systems.

In yet another aspect, the mold can be formed with multiple spaced apart pocket defining male mold elements. At the end of each molding step wherein a plurality of pockets can be formed at the same time, the mold elements can be withdrawn from the tape and the tape moved to the next position so that the next group of pockets can be formed.

In yet another aspect, a rotary mold which carries a plurality if radially extending male mold elements can be used. In such an arrangement, the carrier tape is wound in part around the rotating multi-element mold.

The tape moves with the rotary mold and at the appropriate station or stations, either fluid under pressure can be injected against the carrier tape thereby driving it against a respective male mold element and/or a conduit or path extending through the mold element can be evacuated thereby increasing a pressure differential against the tape. As a result, the pocket being formed in the region of the tape is brought into greater conformity with the shape of the male mold element.

In another aspect, an axially extending trough can be formed in an embossed tape relative to an upper or seal surface. Spaced apart product positioning features or surfaces can be formed along the trough. In this embodiment, discrete component carrying pockets are not formed. Instead, the product positioning features preclude axial or lateral component movement relative to the tape. Pocket walls are not needed. A seal or cover tape, adhesively attached to the seal surface holds components on the positioning features. In yet another aspect, the trough can be interrupted by embossed laterally extending features or elements between pairs of component positioning features. These laterally extending elements help minimize kinking or distortion as the tape is coiled onto a reel.

Numerous other advantages and features of the present invention will become readily apparent from the following detailed description of the invention and the embodiments thereof, from the claims and from the accompanying drawings.

BRIEF DESCRIPTION OF THE DRAWINGS

FIG. 4 is a sectional view of a carrier tape formed in accordance with the process of FIG. 3;

FIG. 5 is another view of the process illustrated in FIG. 3;

FIG. 6 is a side schematic view of a prior art rotary carrier tape mold;

FIG. 7 is an enlarged perspective view of section of carrier tape formed in accordance with the present invention;

FIG. 8 is a sectional view taken along plane 8—8 of FIG. 7;

FIG. 9 is a sectional view taken along plane 9—9 of FIG. 7;

FIG. 10 illustrates a perspective view of another carrier tape in accordance with the present invention;

FIG. 11 is a sectional view taken along plane 11—11 of FIG. 10;

FIG. 13 is an enlarged sectional view of a portion of FIG. 12 illustrating further characteristics of the molding process of FIG. 12;

FIG. 14 is a perspective view of a portion of another carrier tape in accordance with the present invention;

FIG. 15 is a sectional view taken along plane 15—15 of FIG. 14;

FIG. 16 is an enlarged partial sectional view of a molding process using a rotary mold in accordance with the present invention;

FIG. 17 is a sectional view taken along plane 17—17 of FIG. 16;

FIG. 18 is a block diagram of a molding system in accordance with the present invention;

FIG. 19 is an enlarged top plan view of a portion of yet another carrier tape in accordance with the present invention;

FIG. 20 is a sectional view along plane 20—20 of FIG. 19;

FIG. 20A is a sectional view of an alternate tape with an embossed trough;

FIG. 21 is a sectional view taken along plane 21—21 of FIG. 19;

DETAILED DESCRIPTION OF THE PREFERRED EMBODIMENTS

Figure 1:
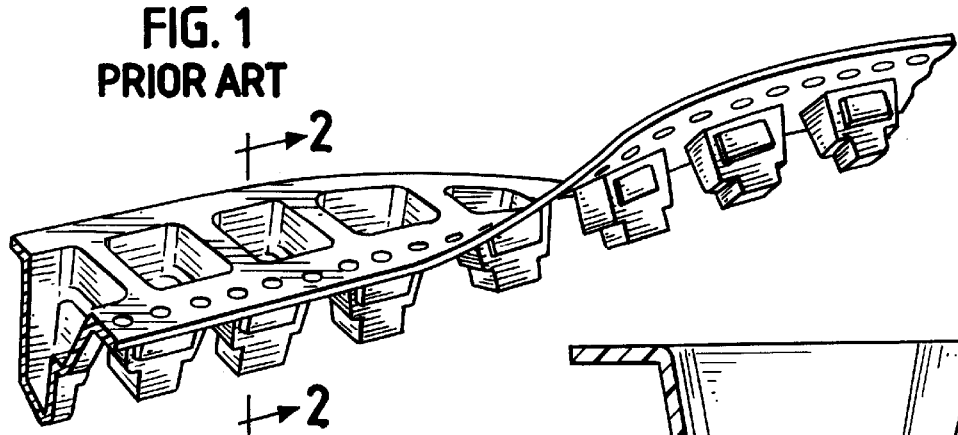
FIG. 1 is a perspective view of a portion of a prior art carrier tape.
Figure 2:
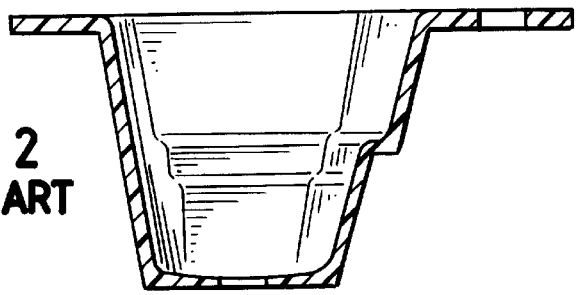
FIG. 2 is a section taken along plane 2—2 of FIG. 1.
Figure 3:
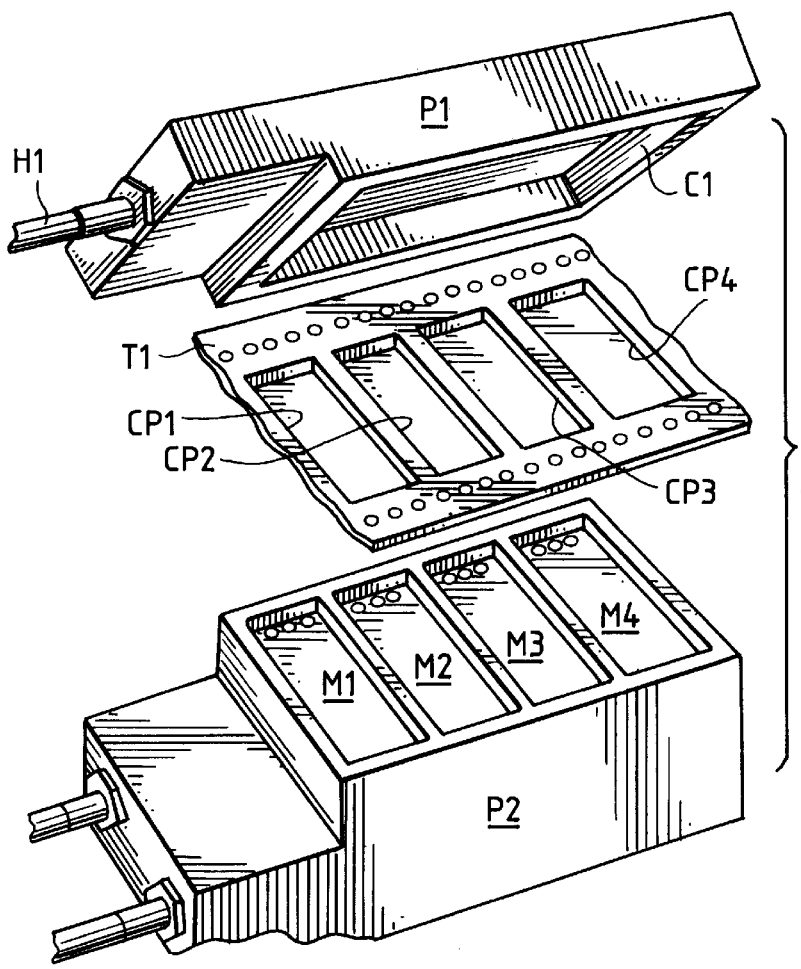
FIG. 3 is an enlarged schematic view of a prior art molding process.

While this invention is susceptible of embodiment in many different forms, there are shown in the drawings and will be described herein in detail specific embodiments thereof with the understanding that the present disclosure is to be considered as an exemplification of the principles of the invention and is not intended to limit the invention to the specific embodiments illustrated.

FIG. 7 illustrates an embossed carrier tape 10 in accordance with the present invention. The tape 10 as illustrated includes a plurality of different component carrying pockets 12a, 12b . . . 12d. For purposes of illustration, the pockets 12a . . . 12e of the tape 10 are illustrated having different shapes for purposes of explaining the present invention. The pockets of the tape 10 are intended to carry, for example, connection pins that are to be automatically inserted into an electronic product.

Each of the pockets, such as 12a is formed by deflecting a respective surface region of the surface 10-1 of the tape 10 as described below. Each of the pockets, such as 12a, has a respective extension surface, such as 12'a, formed from a respective region of the second surface 10-2.

The carrier tape 10 is formed from a standard planar, elongated flexible thermal plastic tape. In each instance, the component carrying pockets 12a . . . 12e of the tape 10 exhibit lower tolerance characteristics wherein parts can be positioned repeatedly within ±0.001 inches. In addition, as discussed subsequently, light diffusing patterns can be molded into the tape 10 on the product carrying side for purposes of improving the performance of scanning or optical monitoring systems.

FIG. 8 illustrates a sectional view of pocket 12a with an exemplary connection pin PN of a first orientation to be carried therein. The pocket 12a exhibits an internal component carrying pocket surface 14a which includes a product positioning boring and support surface 14b.

The exemplary tape 10 is intended to be used to carry small electronic connector pins. Each pin PN is carried in a separate pocket with a selected orientation. For example with respect to FIG. 8, the boring and positioning surface 14b would be intended to position and carry the discrete connector pin PN.

The component carrying pocket 14a is bounded by planar regions 14e, f. The regions 14e, f as discussed subsequently, have a thickness corresponding to that of an unprocessed tape.

FIG. 9 illustrates an alternate form of a pocket 12c. The pocket 12c is intended to position and carry the same type of pin PN as was carried by the pocket 12a. However, for illustrative purposes the pin PN is shown with a different orientation in FIG. 9.

As illustrated in FIG. 9, the pocket 12c includes an interior surface 16a, an exterior surface 12'c and a pin receiving and support region 16b. The pocket 12c as illustrated in FIG. 9 includes first and second planar bounding regions 16e, 16f. Additionally, the pocket 16a includes first and second spaced apart linear depressions 16g, 16h. These depressions provide an elevated support for the positioning surface and boring 16b which receives the pin PN. As a result of the elevation of the region 16b, the part PN does not extend beyond a common terminating surface indicated generally at 16i.

FIG. 10 and 11 illustrate another carrier 20 in accordance with the present invention but for a different type of a component. The carrier tape 20 is formed of a plurality of substantially identical pockets such as 22i.

The sectional view, FIG. 11, illustrates details of a representative one of the pockets 22i of the carrier tape 20. The pocket 22i includes a lower positioning feature or surface 22a, an adjacent pair of product positioning surfaces 22b, c and an upper positioning surface 22d generally parallel to the surface 22a. Spaced apart planar edge regions 22c, 22d bound the pocket 22i.

A component, such as contact element C 1 illustrated in phantom is received within the pocket 22i and positioned by the surfaces 22a . . . 22d. It will be understood that the surfaces 22a . . . 22d could assume a variety of configurations based on the shape of the particular component or portion thereof, such as connector leads, which are to be positioned for subsequent automatic assembly. It will be understood that the configuration of the component to be carried is not a limitation of the present invention.

Figure 12:
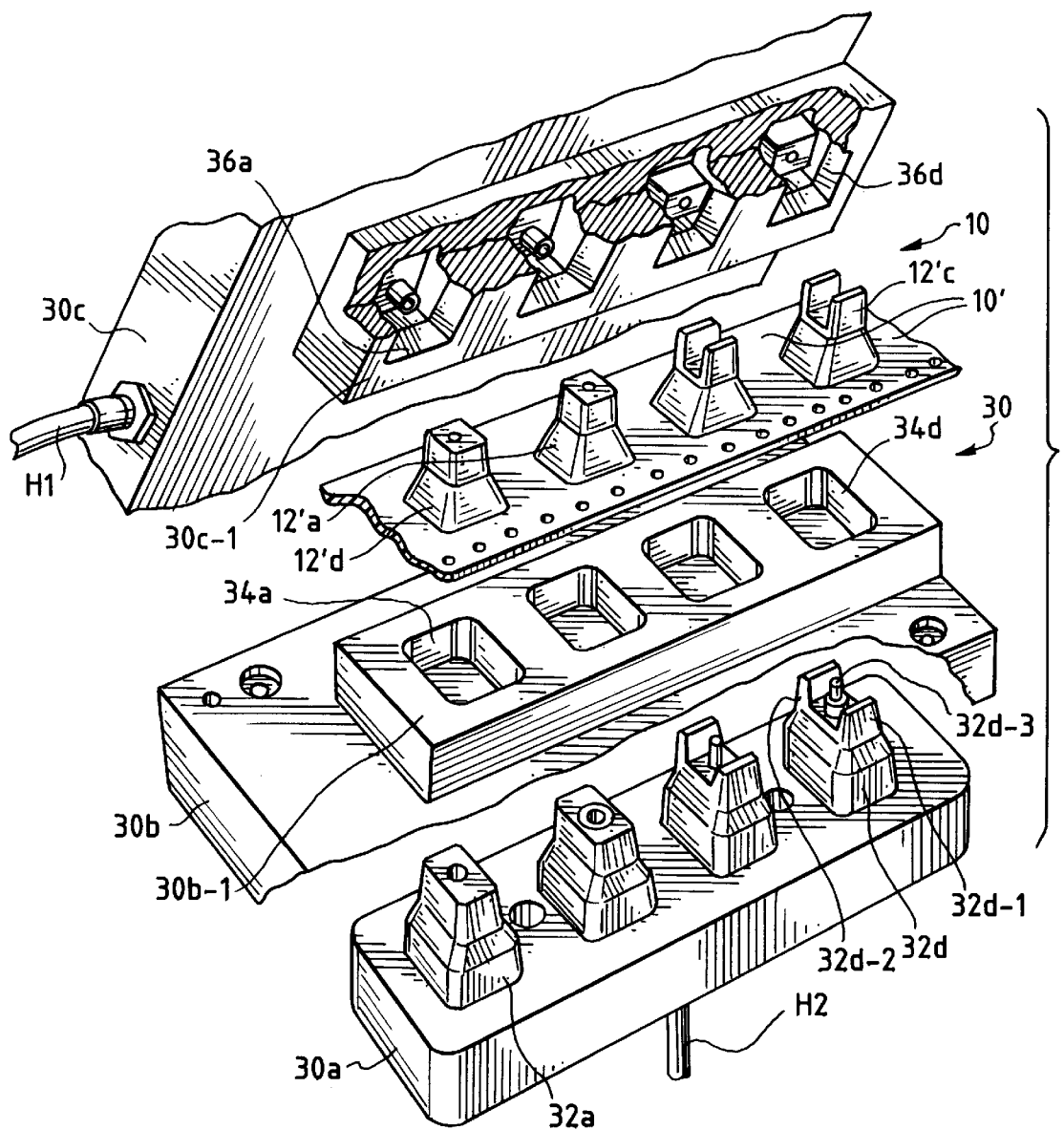
FIG. 12 is an enlarged exploded, fragmentary, perspective view of a carrier tape molding process in accordance with the present invention.

FIG. 12 illustrates an exemplary multi-part mold system or assembly 30 usable for manufacturing the tape 10, for example. A similar mold assembly could be used, with elements having different shapes, to manufacture the tape 20.

This system 30 includes three elements. Element 30a carries the detail, in the form of a male mold element to be formed into a component carrying pocket. 30b is a clamping ring which slideably receives the element 30a during the molding or embossing process. Element 30c, illustrated at an angle in FIG. 12 for purposes of explanation only, carries a plurality of female mold cavities each of which is intended to mate with a respective one of the male mold elements from the element 30a during the molding process.

The element 30a carries four different male molds, 32a . . . 32d, for exemplary purposes only. The molds 32a . . . 32d correspond to the interior shapes of the pockets 12a . . . 12d.

The clamping element 30b defines a plurality of identical spaced apart bores 34a . . . 34d which slidably receive respective ones of the male elements 32a . . . 32d. A planar clamping surface 30b-1 surrounds each of the bores 34a 34d.

The element 30c carries a plurality of female molds 36a . . . 36d which are intended to substantially conform to and mate with the male molds 32a . . . 32d. As described subsequently, when so arranged, therein a predetermined space therebetween for the molded material which forms the respective pocket, such as 12a . . . 12d. A planar clamping surface 30c-1 surrounds each of the cavities 36a . . . 36d.

A fluid pressure hose H1 extends from the female element 30c. An evacuation-hose H2 extends from the male element 30a.

During the molding process, the carrier tape 10 is preheated to a predetermined temperature in the order of 325°–340° F. prior to entering the mold station 30. With the elements 30a and 30c retracted, the tape 10 is positioned in the mold station 30 adjacent to the element 30b.

The mold elements 30b, 30c are moved linearly relatively toward one another, for example by holding the element 30b fixed and moving the element 30c theretoward. When the elements 30b and 30c have moved together, the tape 10 is clamped therebetween by the surfaces 30b-1 and 30c-1. The tape 10 is still in a planar state.

In the next step, the mold element 30a is forced toward and into the surface 10-1 of the tape 10. Pneumatic or hydraulic actuators can be used. For example, pneumatic pressure on the order of 100 psi can be used. This relative movement of the element 30a toward the female mold element 30c drives each of the respective defining male extensions 32a, 32b, 32c, 32d into the tape 10 thereby deforming same in accordance with the surfaces on each of the respective male mold elements. The regions of the deforming tape 10 are driven into the respective female elements such as 36a, 36b . . . 36d by the surfaces of the respective male mold elements 32a . . . 32d.

The adjacent planar regions of the carrier tape 10, such as 14c, 14f, are clamped between surfaces 30b-1 and 30c-1 and are held substantially stationary. This results in a stretching and a deforming of the portions of the carrier tape 10 which are bounded by the openings 34a . . . 34d which are aligned with the female molds 36a . . . 36d.

The portions of the carrier 10 adjacent to each of the respective regions are forced by the respective male mold elements, such as the element 32a, into the respective female mold such as the mold 36a. This imparts to the deformed region of the carrier 10 the shape of a pocket, for example, the pocket 12a which carries on its internal surfaces the detail of the male mold element 32a. External surfaces of the pocket 12a are in part formed by the respective female mold 36a.

Further details of the molding process are illustrated in FIG. 13. As illustrated in FIG. 13, with respect to the mold element 32d, the spacing between the male mold element 32d and the respective female cavity 36d is on the order 0.016 inches. This spacing corresponds to the thickness of the carrier tape 10 in its normal unembossed state. Hence, in the regions where the surfaces 30b-1 and 30c1 clamp the tape 10, the spacing between those elements is in the order of 0.016 inches. The regions 10' of the carrier 10 which are trapped therebetween do not move appreciably during the embossing or molding process.

As further illustrated in FIG. 13, as the male mold element 32b exhibits relative movement toward the female mold cavity 36d, the developing wall of the pocket 12c is stretched, deformed and thinned. As a result, the side wall thickness of the pocket 12c will be reduced from 0.016 inches to about 0.006–0.007 inches leaving a gap 40 between the surface 12'c thereof and the female mold element 36d.

Fluids such as air or hydraulic fluid can be injected into the gap 40 via conduits 42a, 42b coupled to hose H1 to apply pressure to the surface 12'c thereby forcing the respective portion of the carrier against the surfaces of the male mold element 32d thereby more closely replicating the features thereof.

Via conduits 44a . . . 44d coupled to hose H2, a vacuum can be drawn relative to the carrier tape material between the mold elements 32d and 36d. This increases the gradient or pressure different between the exterior surface 12'c of the pocket 12c thereupon further forcing the carrier tape material in the regions between the two mold elements against the male mold element 32d. In the event that pneumatic pressure is injected via the conduits 42a, 42b, air pressure on the order to 30–150 PSI can be used for the purpose of conforming the carrier tape material to the exterior surfaces of each of the male mold elements 32a . . . 32d.

As illustrated in FIG. 13, the shape of the carrier pocket 12c is precisely defined by the features and surfaces of the male mold element 32d against which that material is forced.

As a result, wall variations which may occur during the molding process, as illustrated by thicker wall region 46a and thinner wall regions 46b, will appear on the outer surface 12'c of the pocket. Thus, the variability of the wall thickness of the respective pocket, which has now been translated to the outer surface thereof, has been eliminated as a source of variability of the position of the electronic component being carried by the molded pocket and boring 16b. Using the above-described methodology as illustrated in FIGS. 12 and 13, product positioning detail can be molded into the component pocket with a tolerance in the order of ±0.001 inches. As illustrated in FIG. 12, the mold system 30 can be configured with multiple pocket molds. For example, a four-element mold as is illustrated in FIG. 12, depending upon pitch, can generate up to 200 meters per hour of embossed tape.

FIGS. 14 and 15 illustrate a carrier structure 50 made in accordance with a rotary mold 56 as illustrated in FIGS. 16 and 17. The carrier 50 is formed of a plurality of spaced apart component receiving pockets, for example pocket 50i.

While the carrier 50 can be manufactured using mold system of the type illustrated in FIGS. 12 and 13, it can alternately be manufactured using a rotary mold as illustrated in FIG. 16. The mold 56 of FIG. 16 is formed with a plurality of angularly disposed, substantially identical, male mold elements 56a, b, c, d.

A linear incoming carrier tape having a planar region 58a is drawn against the rotating mold 56 along a curve. The tape 58a which has been preheated is then forced against mold element 56b by fluid pressure 59 which could be either pneumatic, hydraulic at a work station thereby forming the respective component receiving pocket, such as 50i.

In addition to or alternately, the mold 56 can be provided with a plurality of evacuation channels 60a . . . 60d whereby a vacuum can be applied to the interior of the pocket being formed by the mold element 56b in the region 58b thereby increasing a pressure differential between the exterior and interior size of the pocket. This differential in turn draws the carrier tape in the region 58b against the features and surfaces of the mold element 56b thereupon imparting the features of those surfaces to the inside of the respective component carrying pocket 50i.

FIG. 18 illustrates a molding system usable for manufacturing product carrier tapes, such as the tape 20. The system 70 includes a tape feed reel 72 from which planar carrier tape 74 is fed.

The tape 74 passes through a heating station indicated generally at 76. Subsequently it passes through a multiple unit molding station, which includes for example a mold system such as the mold system 30 in FIG. 12. Subsequent to leaving the molding station 30, the embossed or molded tape 20 is wound onto a take-up reel 78. A control element 80 coupled to the various components of the system 70 can be used to monitor and oversee system operation.

FIG. 19 is a top plan view of yet another, carrier tape 84. The tape 84 is formed with a planar plastic upper or seal surface 86. Embossed in the seal surface 86 is a plurality of product receiving recesses or depressions 86-1, 86-2 . . . 86-n. The embossed tape 84 could be formed using rotary mold 56 for example.

As illustrated, a representative depression 86-2 in the tape 84 is defined by a bottom 87a and axially extending side regions 87b, c. Depression 862 is further defined by embossed, laterally extending ridges or shoulders 87d, e.

The ridges or shoulders 87d, e are depressed relative to seal surface 86 (best seen in FIG. 20). The ridges 87d, c extend between pairs of component positioning elements such as 86-1*a*, 1*b*; 86-2*a*, 2*b* and 86-3*a*, 3*b*. A component C2 (see FIG. 24) might for example sit on top surfaces of 86-2*a*, 2*b* and have contacts that extend, in part, along front and back edges such as 86-2*f*, 2*g*. The top surfaces of 86-2*a*, 2*b* in combination with side surfaces such as 86-2*f*, 2*g* will thus lock C2 into a fixed position in depression 86-2.

The spacing shoulders 87*d*, 87*e* are not intended to position C2. The lateral protrusions 87*d*, *e* are intended to facilitate coiling tape 84 in a reel such as the reel 78. They function to minimize kinking of the embossed tape.

The tape 84 can be regarded in FIG. 19 as having been embossed with a continuously extending trough indicated generally at 84*a*. The trough 84*a* is interrupted by the depressed anti-kinking elements 87*d*, 87*e* and component spacing elements 86-2*a*, 2*b*.

Alternately, as illustrated in FIG. 20A, trough 84*a*' can be embossed into tape 84' without the laterally extending elements 87*d*, 87*e*. Tape 84' will then be coiled to minimize side-wall kinking even in the absence of the elements 87*d*, 87*e*. Component C2' (shown in phantom) is illustrated in FIG. 20A positioned on and held in place by elements 86-2*a*', 2*b*'.

Each of the depressions 86-1 . . . 86-*n* carries at least an embossed or molded light reflecting pattern 88*a*. The pattern 88*a*, illustrated on the lower surface 87*a* of the respective carrier depression 86-1, 86-2 . . . 86*n*, beneficially disperses and reduces reflections of light incident upon the respective depression or region of the carrier tape. Alternately or in addition, undulating patterns can be molded into the side walls, such as the corrugated patterns 88*b* illustrated in FIG. 19. It will be understood that the patterns 88*a*, 88*b* can be used alone or in combination. The patterns 88*a*, 88*b* are imparted into the respective depressions in the trough 84*a* from the respective male mold elements. The undulations 88*b* not only deflect and diffuse reflected light, they also strengthen the respective pocket or trough side walls thereby minimizing kinking or distortion.

Additionally, patterns can be molded or embossed on upper and lower surfaces of the tape 84. Pattern 88*c* illustrated in FIG. 19 can be molded into the edge regions or seal surface 86 of the tape 84 or between carrier pockets, if desired. The pattern 88*c* is imparted to the tape 86 at a molding station from clamping surfaces such as the surfaces 30*b*-1 and 30*c*-1. The location and arrangement of the patterns on the respective surfaces 30*b*-1 and 30*c*-1 determines where those patterns are imparted to the tape 84.

As an alternate to the pattern, as illustrated at 88*c*, the seal surface 86 can be roughened (indicated at 84*b*, FIG. 24) to improve adherence characteristics, as described subsequently, of an adhesively bonded cover tape 89.

Figure 22:
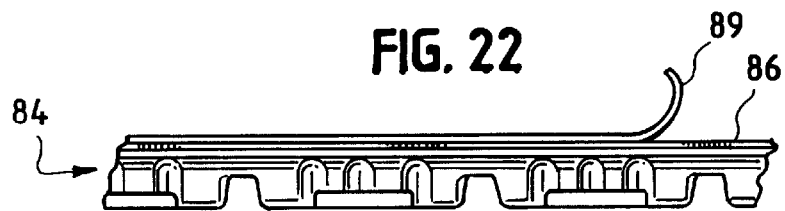
FIG. 22 is a side elevational view of the carrier tape of FIG. 19 carrying a partly removed, adhesively attached, cover tape or a seal surface thereof.

FIG. 22 illustrates the tape 84 with the adhesively attached cover tape 89, illustrated in a partly removed state. The removable cover tape 89 can be attached to seal surface 86. That surface in turn can carry patterns 88*c* or be abraded 84*b* or otherwise processed to produce a roughened or textured surface during or after the molding step. This processing in turn improves the adherability of the cover tape 89 to the seal surface 86.

Figure 23:
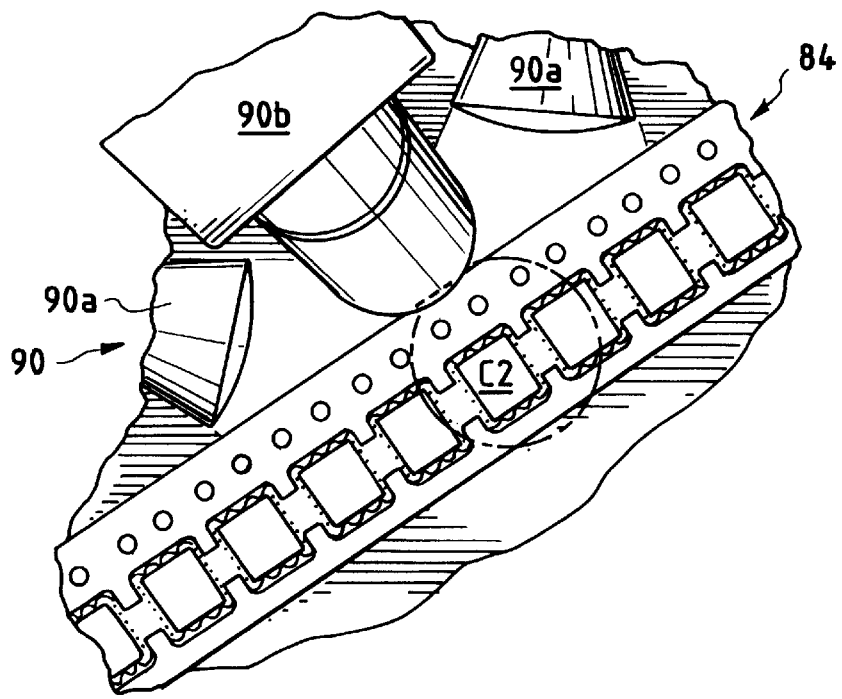
FIG. 23 is an enlarged block diagram of a view of a scanning or optical monitoring system in accordance with the present invention.
Figure 24:
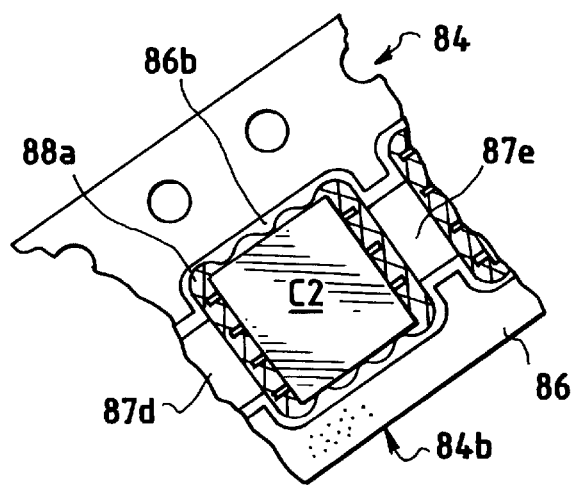
FIG. 24 is an enlarged fragmentary view of a region of the carrier tape of FIG. 23.

FIG. 23 illustrates a tape, such as the tape 84 which has been loaded with components C2, passing through a scanning or optical monitoring system 90. Such systems typically include one or more sources of illumination 90*a* and an optical scanner 90*b*. As is illustrated in FIG. 24, a representative pocket which carries a component C2 also carries light diffusing patterns 88*a* and 88*b* for the purpose of minimizing reflections from sources 90*a*. Components C2 which register appropriately with the scanning system 90 can in turn be picked up and automatically assembled into a predetermined product.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed:

1. A product carrier comprising:
    a flexible planar plastic member;
    a product receiving pocket molded in the planar member wherein the pocket includes an interior product receiving region bounded, in part, by variable thickness side walls and at least one product positioning surface formed therein wherein the surface is formed in response to a corresponding surface of a male mold element engaging and deflecting a portion of the planar member; and
    wherein said positioning surface has a dimensionally accurate impression of a portion of a perimeter of the product which is to be closely fitted into the pocket and wherein a corresponding exterior region of the pocket spaced from the positioning surface by a thickness parameter has a less accurate representation of that impression.

2. A carrier as in claim 1 wherein a plurality of intersecting sides is formed in response to the mold element deflecting the portion of the planar member and wherein the surface is carried between at least two of the sides.

3. A carrier as in claim 2 wherein first and second sides extend spaced apart and substantially parallel to one another.

4. A carrier as in claim 3 wherein third and fourth sides extend spaced apart and substantially parallel to one another intersecting each of the first and second sides wherein the sides are integrally formed with the planar member and seamlessly intersect one another.

5. A carrier as in claim 3 which includes at least first and second component positioning surfaces wherein at least one of the surfaces is seamlessly coupled to at least one of the sides wherein the sides and the surfaces are formed in response to the male mold element exhibiting mirror images thereof and deflecting and shaping a region of the planar member to form the sides and surfaces in conformity with the shape of the mold element.

6. A carrier as in claim 1 wherein the pocket includes a closed end upon which the surface is formed.

7. A product carrier comprising:
    a flexible planar plastic member;
    a product receiving pocket molded in the planar member wherein the pocket includes at least one product positioning surface formed therein wherein the surface is formed in response to a corresponding surface of a male mold element engaging and deflecting a portion of the planar member;
    wherein the pocket includes a closed end upon which the surface is formed; and
    wherein the end carries, at least in part, a molded light deflecting pattern.

8. A product carrier comprising:
    a flexible planar plastic member;
    a product receiving pocket molded in the planar member wherein the pocket includes at least one product positioning surface formed therein wherein the surface is formed in response to a corresponding surface of a male mold element engaging and deflecting a portion of the planar member;

wherein a Plurality of intersecting sides is formed in response to the mold element deflecting the portion of the planar member and wherein the surface is carried between at least two of the sides; and wherein at least one of the sides carries a molded, light deflecting pattern.

9. A carrier as in claim 1 wherein a region of the planar member, adjacent to the pocket, carries a molded pattern.

10. A carrier as in claim 7 wherein the molded pattern is formed inside of the pocket.

11. A carrier as in claim 8 wherein the molded pattern is formed inside of the pocket.

12. A carrier as in claim 1 which includes a removable tape which covers the pocket.

13. A carrier as in claim 9 which includes a removable tape which covers the pocket.

14. A carrier as in claim 13 which includes at least one adhesive layer for releasably attaching the tape to the planar member.

15. A carrier as in claim 14 wherein the tape and the adhesive are removable together from the planar member.

16. A carrier as in clam 14 wherein the member carries at least one enhancing feature for improved attaching of the tape thereto.

17. A carrier as in claim 16 wherein the enhancing feature includes a roughened region.

18. A component carrier tape comprising:

a planar, flexible tape having first and second spaced apart surfaces extending therealong;

a plurality of spaced apart component positioning surfaces formed by deflecting respective regions of the first surface which in turn deflect respective regions of the second surface;

wherein the positioning surfaces are coupled by axially oriented, non-deflected portions of the first surface extending along the tape adjacent to the positioning surfaces but not therebetween; and wherein said positioning surfaces are formed in reverse impression of a portion of a component shape to closely conform to an outside profile of a component carried thereby and wherein wall thickness variations appear on the deflected regions of the second surface.

19. A tape as in claim 18 wherein each pair of positioning surfaces intended to carry different components is separated by a deflected region of the first surface extending therebetween.

20. A component carrying tape comprising:

a planar, flexible tape;

a trough embossed in and extending along the tape;

a plurality of spaced apart component carrying surfaces formed in the trough wherein the surfaces are adapted to retain components in spaced relation thereon in the absence of laterally extending, component restraining features that extend between pairs of surfaces for different components.

21. A tape as in claim 20 which includes laterally extending features between pairs of surfaces to minimize kinking of the trough while coiling same.

22. A carrier tape for components comprising:

an elongated, planar body portion having a first thickness with first and second spaced apart planar surfaces, a plurality of pockets formed in the body portion wherein the pockets protrude from one of the surfaces, wherein each of the pockets defines an internal component receiving region bounded by variable width side walls having a thickness less than the first thickness wherein selected surfaces within the pocket matingly and supportably engage corresponding surfaces of a respective component and wherein the exterior shape of the pocket exhibits a male representation of the interior region wherein the male representation is degraded at least as a result of the variable width sidewalls.

23. A tape as in claim 22 wherein each pocket is bounded by first and second laterally disposed body regions of the first thickness.

24. A tape as in claim 22 which carries an axially extending, molded, light deflecting pattern.

25. A carrier tape as in claim 24 wherein the light deflecting pattern includes undulating molded pocket side walls.

26. A carrier tape as in claim 22 wherein the first thickness is less than 0.020 inches.

27. A carrier tape as in claim 26 wherein pocket side wall thicknesses will be less than 0.01 inches.

28. A carrier tape as in claim 22 wherein the selected surfaces have a positional tolerance on the order of ±0.001 inches.

* * * * *